United States Patent [19]
Sadjadpour

[11] Patent Number: 5,996,095
[45] Date of Patent: *Nov. 30, 1999

[54] SET PARTITIONING FOR SUB-OPTIMAL DECODING

[75] Inventor: Hamid R. Sadjadpour, Randolph, N.J.

[73] Assignee: AT & T Corp, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/910,479

[22] Filed: Jul. 25, 1997

[51] Int. Cl.$^6$ .................................................. H03M 13/00
[52] U.S. Cl. .......................................................... 714/709
[58] Field of Search ........................... 371/6, 43.6, 22.33, 371/27.2; 375/222, 262, 265, 341; 714/709, 794, 728, 739

[56] References Cited

U.S. PATENT DOCUMENTS

| | | | |
|---|---|---|---|
| 5,105,442 | 4/1992 | Wei | 375/262 |
| 5,371,471 | 12/1994 | Chennakeshu et al. | 329/304 |
| 5,546,430 | 8/1996 | Liao et al. | 375/341 |

OTHER PUBLICATIONS

Asilomar 1996, Technical Paper: "Pseudo–Maximum Likelihood Data Estimation of Digital Sequences in the Presence of Intersymbol Interference", Authors: H.R. Sadjadpour & C.L. Weber, pp. 1–4.

Asilomar 1994, Technical Paper: "Simplified Pseudo–maximum Likelihood Data Estimation Algorithm", Authors: H.R. Sadjadpour & C.L. Weber; pp. 1–5.

Thesis:/University of Southern Calif.: "Blind Equalization Techniques Using Maximum Likelihood Criterion", Author: H.L. Sadjapour, Jan. 1996, (113 pages=cover page–xi; pp. 1–102).

*Primary Examiner*—Trinh L. Tu

[57] ABSTRACT

A system and method for performing set partitioning to recover M-ary modulated digital data symbols. The set partitioning technique reduces the complexity of sub-optimal algorithms in communications systems such as wireless communication systems utilizing PML, SPML, and APML algorithms. The system and method reduces the number of searches in a system by choosing an average value for the transmitted signals in the system.

15 Claims, 3 Drawing Sheets

J = 8

J = 4

J = 2

SET PARTITIONING FOR SUB-OPTIMAL DECODING

FIELD OF THE INVENTION

This invention relates to communication receivers and methods which utilize set partitioning in sub-optimal decoding algorithms and, more particularly, to receivers and methods which utilize set partitioning in pseudo maximum likelihood data estimation (PML) algorithms, simplified pseudo maximum likelihood data estimation (SPML) algorithms, and/or adaptive pseudo maximum likelihood data estimation (APML) algorithms.

BACKGROUND OF THE INVENTION

Current state of the art mobile communication technologies (e.g., cellular phones) employ complex computational algorithms to decode digital data which is transmitted as M-ary modulated digital data. Signal processing devices in mobile devices must decode the data in real time. Further, the signal processing devices typically operate using battery power. Thus, the computational capacity of the signal processing devices within the receiver is limited. Accordingly, it is necessary to simplify the computations while still maintaining the robust characteristics of the decoding algorithms.

In wireless communications systems, the VA and DFE are common techniques used as equalizer in the receiver. The VA is the optimum approach and at the same time, its computational complexity and memory requirements is proportional exponentially to the length of the channel impulse response. This is sometimes impossible for systems either because the channel impulse response is very long or there are power limitations and it is not possible to have large size of memory. On the other hand, the DFE has minimum requirements in terms of the memory and computational complexity, but its performance is not as well as the VA. The PML algorithm is sub optimal and there is a trade-off between complexity and the performance. The new set partitioning technique allows the designer to have more flexibility in terms of the trade-off for M-ary signal set systems.

One optimal solution to decode the data symbols is the use of the Viterbi algorithm (VA). However, the computational complexity of the Viterbi algorithm increases exponentially with the length of the channel impulse response (CIR). This is obviously not practical to implement for channels with long impulse responses. Another solution is the use of a decision feedback equalizer (DFE) which is computationally less demanding than the Viterbi algorithm. However, where the system experiences multi-path fading, the performance of this equalizer may not be acceptable. Accordingly, a new approach is required which has capable performance and manageable computational complexity.

SUMMARY OF THE INVENTION

The present invention greatly improves current communication systems by decreasing the computational complexity required to decode modulated digital data symbols. The invention is particularly adapted to reduce the computational complexity of the PML, SPML, and APML algorithms by using a unique set partitioning method for an M-ary signal set in either a mobile wireless or fixed system. The current invention reduces the complexity of the PML, SPML, and APML algorithms for M-ary signal set by dividing a window of data symbols received during a predetermined time interval into first and second data. The first data is searched using all M-ary symbols and the second data is partially searched using signal sets formed by partitioning symbols in the constellation into a plurality of sets. The sets are partitioned such that the sets have a multiple of two symbols and are arranged to minimize the Euclidean distance between the symbols in the set. Further, the sets are preferably chosen to minimizing the total Euclidean distance for all of the sets.

The present invention is well suited for channel impulse responses with a relatively long duration such as those having a symbol duration of up to about 100 or more symbols. The invention provides much better performance than the DFE while at the same time providing less complexity is less than the Viterbi algorithm. Additionally, the invention requires substantially less memory than the Viterbi algorithm. This is particularly important for systems with maximum power limitations such as battery operated mobile transmitters. The use of the present invention represents a significant advance in the use of sub-optimal algorithms in terms of both computational complexity and the performance.

In a further aspect of the invention, the set partitioning may be applied specifically to reduce the complexity of the PML, SPML, and APML algorithms. These algorithms are commonly used in wireless communication systems. In still further aspects, the set partitioning reduces the number of searches by choosing an average value for the transmitted signals in the system.

These and other features of the invention will be apparent upon consideration of the following detailed description of preferred embodiments. Although the invention has been defined using the appended claims, these claims are exemplary in that the invention is meant to include the elements and steps described herein in any combination or subcombination. Accordingly, there are any number of alternative combinations for defining the invention, which incorporate one or more elements from the existing claims or from the specification, including the drawings, in various combinations or subcombinations. It will be apparent to those skilled in the art of mobile transceiver theory and design, in light of the present specification, that alternate combinations which include a the set partitioning may be utilized to achieve the advantageous results outlined herein. It is intended that the written description contained herein cover all such modifications and alterations.

DETAILED DESCRIPTION OF PREFERRED EMBODIMENTS

Figure 1:
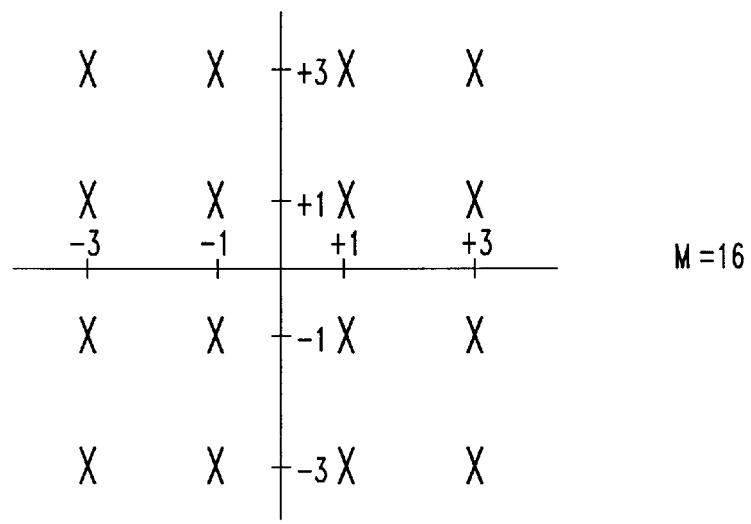
FIG. 1 shows the M-ary signal set for the case M=16.
Figure 2A:
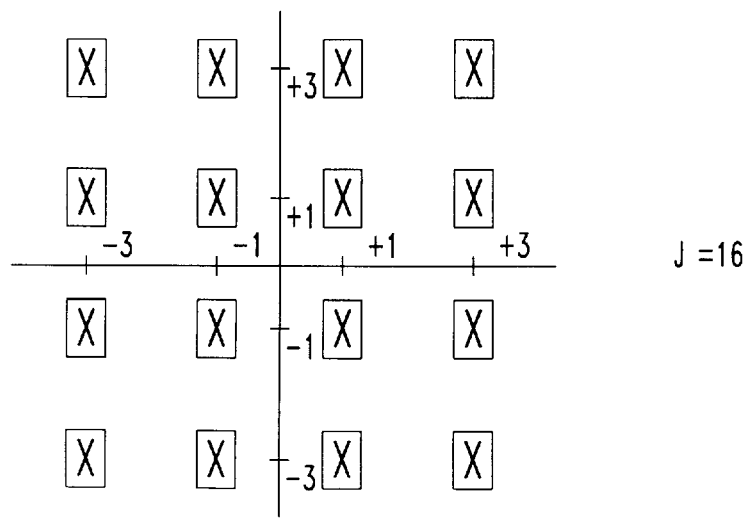
FIG. 2a shows the set partitioning for $J_i$=16.
Figure 2B:
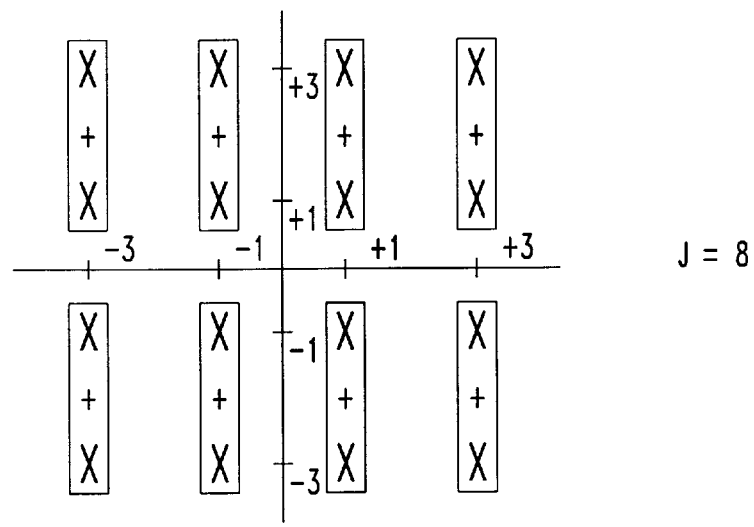
FIG. 2b shows the set partitioning for $J_i$=8.
Figure 2C:
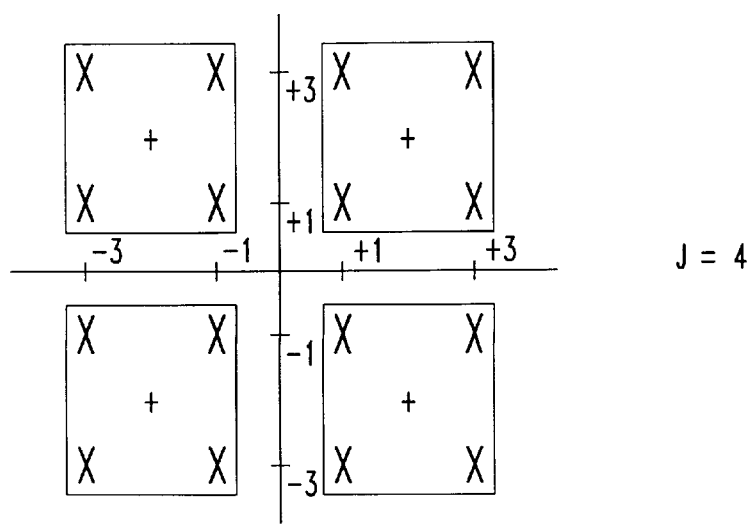
FIG. 2c shows the set partitioning for $J_i$=4.
Figure 2D:
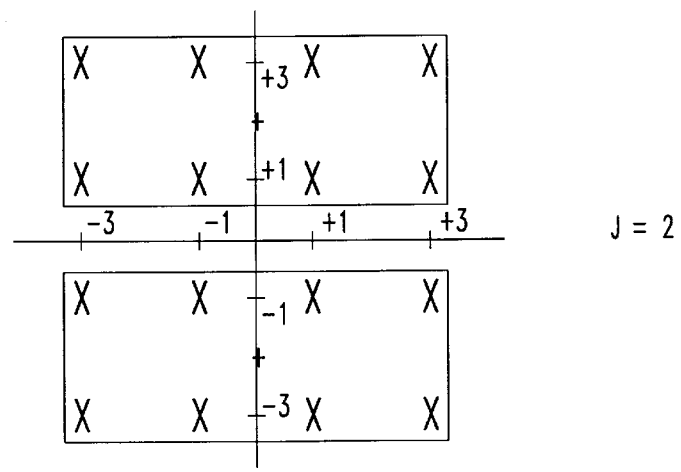
FIG. 2d shows the set partitioning for $J_i$=2.

Embodiments of the present invention may be described with reference to FIGS. 1–2d. As is well known in the art, the real and imaginary numbers in FIGS. 1–2d correspond to orthogonal sine and cosine signals which are utilized to transmit the M-ary digital data symbols. The sampled results may be calculated using set partitioning.

The sets may be variously formed. In general, the data points for each sample for the case where M=16 is shown in FIG. 1. With the most recent interval, it may be desirable to partition the set into 16 different values (FIG. 2a). As you move further forward in time, e.g., the next most future sample, it may be desirable to partition the set less finely with, for example, J=8. In this case, it is desirable to partition the set such that the sets have a multiple of two symbols and are arranged to minimize the Euclidean distance between the symbols in the set. Further, the sets are preferably chosen to minimizing the total Euclidean distance for all of the sets. Once the set partitioning is chosen for a particularly historical sample of the incoming data, it may be desirable to calculate an average value for the data within the set and to use this average value in the calculations. The use of the sets and the average value substantially reduces the computational complexity for samples of the incoming data.

In general, the above process can continue with the sets being viewed in less fine increments. For example, FIG. 2c shows the case where J=4. In this case, the data in each of the quadrants are averaged before being factored into the calculation. Similarly, in FIG. 2d, the real data is averaged and the imaginary data having a positive value is averaged in one set and the imaginary data having a negative value is averaged in a different set. In general, the sets may be variously constructed so long as the total Euclidean distance is minimized and the Euclidean distance for all sets is also minimized. For each set, you can have two, four, eight, etc., symbols. In exemplary embodiments, the number of symbols in each set is divisible by two.

As you progress forward in time, each symbol set becomes increasingly less important. Accordingly, you can partition each set in increasingly coarse blocks and take the average of those blocks in the calculations. Data which occurred further forward in time is less important and therefore the sets may be combined in less detail. For example where M=16 and the data in questions is three time slots forward you may utilize, for example, J= to 8 so that there are two data points in each set and when. Where the data in question is five or six time slots forward exemplary embodiments may utilize four data points in each set. As you progress even further forward in time it may be desirable to utilize 8 data points per set.

The particular implementation of the present invention may be variously configured depending on a particular application. For example, it may be desirable to choose a particular set partitioning depending on the particular channel impulse response. The particular set partitioning is application specific and may be determined by empirical data or simulated results. The optimal set partitioning, e.g., whether to have J=8 at the second or third time slot, is a tradeoff between obtaining reasonable performance with acceptable processing complexity.

Aspects of the present invention introduce a new equalizer which is suitable for fixed as well as mobile wireless services when the signal set is M-ary. The future fixed and mobile wireless services will include broadband services as well as narrow band services with very high channel bit rate capability. In this regard, adaptive equalization techniques are required to overcome the effects of multipath delay spread over the radio channels. Aspects of the present invention relate specifically to reducing computational complexity of the PML, SPML, and APML algorithms for systems with M-ary signal set.

The general baseband representation of the received signal is given as $$r(k) = \sum_{i=1}^{L} h(i)a(k-i+1) + n(k) \tag{1}$$

where $r(k)$ is the complex received sample signal at time $kT_s$ ($T_s$ is symbol period), $h(i)$ is the i-th tap of the channel impulse response (CIR), $a(k-i+1)$ is the (k-i+1)-th transmitted data symbol, and $n(k)$ is the k-th sample of additive white Gaussian noise with single-sided power density of $N_0$. The channel is a finite impulse response (FIR) filter with memory of length L.

The transmitted data symbols are in a quadrature amplitude modulation (QAM) system. The signal set is M-ary, where M is $2^m$ signal points. The bits are independent and identically distributed. The signal points are chosen from a rectangular lattice with odd-integer coordinates, but this technique is valid for all types of signal sets. FIG. 1 shows the signal set for M=16.

The Pseudo-Maximum Likelihood data estimation (PML) algorithm searches for the best data sequence of length l and selects only the first data. This algorithm is described here assuming that the CIR is either known, i.e., $\underline{h}_L = [h_1, h_2, \ldots, h_L]$, or it is estimated by some techniques such as LMS or RLS algorithms, i.e., $\hat{h}_L = [\hat{h}_1, \hat{h}_2, \ldots, \hat{h}_L]$. The transmitted data symbols at time $kT_s$ or prior to this time are known or estimated, and the estimated data symbol at time $kT_s$ is represented as $\hat{a}(k)$. It is useful to determine the best data path of length l for the time interval $[(k+1)T_s, (k+l)T_s]$. The unknown data symbol at time $(k+1)T_s$ is shown as $a(k+1)$. Obviously for a M-ary signal set, there are $M^l$ possible data sequence of length l. The criterion to choose the best data sequence of length l is as follows.

1. Create $a_{k+l}^t$ matrix.

$$a_{k+l}^t = \begin{bmatrix} a(k+1) & \hat{a}(k) & \ldots & \hat{a}(k-L+2) \\ \vdots & \vdots & \vdots & \vdots \\ a(k+l) & a(k+l-1) & \ldots & a(k+l-L+1) \end{bmatrix} \tag{2}$$

2. Calculate the following vector for all $M^l$ possible values of transmitted data symbols of length l.

$$\underline{k}_1 = a_{k+l}^t \hat{h}_L \tag{3}$$

where $\hat{h}_L$ is the estimated CIR.

3. Select the data symbols of length l that has the minimum Euclidean distance D between $\underline{K}_1$ and $\underline{r}_l$, where $\underline{r}_l = [r(k+1), r(k+2), \ldots, r(k+l)]$. D is defined as $$D = |\underline{r}_l - \underline{k}_1|^2 = (\underline{r}_l - \underline{k}_1)^t (\underline{r}_l - \underline{k}_1) \tag{4}$$

4. Select the first data from the estimated data symbols of length l as $\hat{a}(k+l)$ and discard the remaining data symbols.

5. Return to step 1 and continue the algorithm for the next time period.

The PML algorithm is computationally very complex and the Simplified PML (SPML) algorithm is designed to reduce the computational complexity of this algorithm.

The SPML algorithm is designed to reduce the computational complexity of the PML algorithm. the SPML algorithm uses several techniques to reduce the computational complexity of the PML algorithm. These techniques briefly described below:

1. Partitioning of $a_{k+l}^t$ Matrix

There are $M^l$ possible values for $a_{k+l}^t$ matrix. Each one of $a_{k+l}^t$ matrix is multiplied by $\hat{h}_L$. $a^t(k+l)$ matrix is a toeplitz matrix. It has been shown [1] that $M^l$ matrix multiplication can be reduced to $$\frac{M}{2} \times L + l \times M^l$$

scalar multiplication.

2. Using the Previous Estimated Data Symbols

Each time that the PML algorithm searches for the best data sequence of length l, it only selects the first data and discards the remaining (l−1). In the SPML algorithm, the last J data from the best data sequence of length l is transferred to the next time interval. So the search is reduced from $M^l$ to $M^{l-J}$. Obviously, the computational complexity is also reduced accordingly.

3. Using Alternating Minimization Procedure

The alternating minimization procedure technique is modified and applied to the PML algorithm. The basic idea is to divide l−J data into S groups. In this regard, the computational complexity will be proportional to $$M^{\frac{l-J}{S}}$$

All the above techniques are suitable for binary as well as M-ary signal set. However, there were never any method to specifically address M-ary signal sets. The following technique will address this problem and will be explained in detail.

An aspect of the invention is the set partitioning of M-ary signal sets with PML, SPML, and/or APML algorithms. As mentioned earlier, in the SPML algorithm the search to find the best data sequence of length l is proportional to $$S \times M^{\frac{l-J}{S}}$$

This number is based on the fact that each transmitted data symbol can take on M values. The data symbols of length l are in the time interval [k+1, k+l], i.e., [a(k+1),a(k+2), . . . ,a(k+l)]. Each unknown transmitted data symbol a(k+i) for $1 \leq i \leq l$ can take one of M values. In order to reduce the computational complexity of the system, we define a two dimensional set partitioning denoted as Γ(i). The i-th data symbol (i.e., a(k+i)) can take $J_i$ values where $J_i$ can range a number between 2 and M and it is also assumed that $J_i$ is a multiple of 2. Therefore, M possible values of data are partitioned into $J_i$ sets. The set partitioning is constrained such that a) the number $J_i$ are non-increasing, i.e., $J_1 \geq J_2 \geq \ldots \geq J_l$, and b) the partitioning of Γ(i) for all values of i is chosen so that for each Γ(i), the average Euclidean distance of data symbols in each subset is minimized. Also each set partition of Γ(i) is a sub-partition of Γ(i+1) set partition.

The first constraint is based on the fact that the current data has more effect and weight in the calculation of D than the future data. The second constraint is based on the fact that when $J_i$<M, then we use an average of signal values in each subset instead of the actual M values of data. In this regard, it is desirable that in each set the data symbols have minimum distance and this will assure to have a more accurate representation of the transmitted data signals. Since each a(k+i) can take on $J_i$ values instead of M, therefore the complexity is proportional to $J_1 \times J_2 \ldots \times J_S + J_{S+1} \times J_{S+2} \times \ldots \times J_{2S} + \ldots + J_{l-S+1} \times \ldots \times J_l$. The actual number of multiplication depends on how the alternating minimization procedure is applied and there is no single answer for different cases.

Again it should be emphasized that each $J_i$ is assumed to be a power of two and for each partitioning Γ(i), the maximum intrasubset Euclidean distance is minimized. FIG. 2 demonstrates the set partitioning for the case when M=16. The 16-point signal is partitioned into sixteen, eight, four, and two subsets in FIGS. 2a to 2d. It is also important to notice that this set partitioning is not unique and for this particular example, there are more than one way to partition the signal set.

Figure 3:
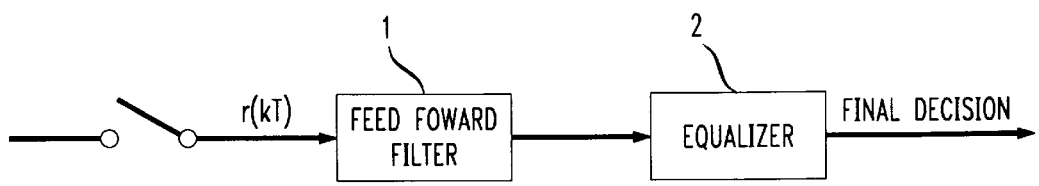
FIG. 3 shows the proposed system to apply the PML-based equalizer.

In one embodiment, the proposed equalizer for M-ary signal set can be applied to a received signal using a system such as that shown in FIG. 3. In FIG. 3 the received signal r(kT) is feed through a feed forward filter 1, and then through the equalizer 2. The equalizer 2 may be a signal processor and may implement any one of a number of methods for set partitioning M-ary signal sets, particularly those estimated using PML, SPML, and/or APML.

While exemplary receivers and methods embodying the present invention are shown by way of example, it will be understood, of course, that the invention is not limited to these embodiments. Modifications may be made by those skilled in the art, particularly in light of the foregoing teachings. For example, each of the elements of the aforementioned embodiments may be utilized alone or in combination with elements of the other embodiments. Further, although the dynamic step size factor has been described in terms of a mobile transceiver, it is also applicable to a stationary transceiver.

What is claimed is:

1. A method for recovering transmitted data symbols comprising:

receiving a signal having M-ary modulated digital data symbols with a constellation of at least four digital data symbols from an environment having intersymbol interference;

examining a window of data symbols received from the signal during a predetermined time interval;

dividing the window of data into first data and second data, where said second data is received during the predetermined time interval after the first data;

searching the first data using all M-ary symbols;

partially searching the second data using M-ary signal sets formed by partitioning symbols in the constellation into a plurality of sets by a decoder, each of the sets having a multiple of two symbols and being arranged to minimize the Euclidean distance between the symbols in the set and for minimizing the total Euclidean distance for all of the sets; and outputting a best data symbol for the window of data.

2. The method of claim 1 wherein the M-ary modulated symbols are received from a mobile communications system.

3. The method of claim 1 including estimating the data symbols using a PML algorithm.

4. The method of claim 1 including estimating the data symbols using a SPML algorithm.

5. The method of claim 1 including estimating the data symbols using a APML algorithm.

6. A method comprising determining a best digital data symbols using data estimation by completely searching data in the most recent time slots of a window of data and partially searching data in previous time slots using averages of M-ary signal sets formed by partitioning symbols in the constellation into a plurality of sets by a decoder, each having a multiple of two symbols and a minimum Euclidean distance between the symbols.

7. The method of claim 6 wherein the M-ary modulated symbols are received from a mobile communications system.

8. The method of claim 6 including estimating the data symbols using a PML algorithm.

9. The method of claim 6 including estimating the data symbols using a SPML algorithm.

10. The method of claim 6 including estimating the data symbols using a APML algorithm.

11. An apparatus comprising a receiver including a signal processor programmed for determining best digital data symbols using data estimation by completely searching data in a most recent time slot of a window of data and partially searching data in previous time slots using averages of M-ary signal sets formed by partitioning symbols in the constellation into a plurality of sets by a decoder, each having a multiple of two symbols and a minimum Euclidean distance between the symbols.

12. The method of claim 11 wherein the M-ary modulated symbols are received from a mobile communications system.

13. The method of claim 11 including estimating the data symbols using a PML algorithm.

14. The method of claim 11 including estimating the data symbols using a SPML algorithm.

15. The method of claim 11 including estimating the data symbols using a APML algorithm.

\* \* \* \* \*